United States Patent

Bogursky et al.

[11] Patent Number: 5,967,365
[45] Date of Patent: Oct. 19, 1999

[54] FEEDER FOR SEPARATING PARTS MOLDED TO A CONTINUOUS CARRIER TAPE

[75] Inventors: Robert M. Bogursky, Encinitas; Giuseppe Bianca, Temecula, both of Calif.; Douglas Green, Spencerport, N.Y.; John Hover, Hilton, N.Y.; Richard Howe; Scott Proctor, both of Brockport, N.Y.

[73] Assignee: Autosplice Systems, Inc., San Diego, Calif.

[21] Appl. No.: 08/904,602

[22] Filed: Aug. 1, 1997

[51] Int. Cl.⁶ .................................................. G07F 11/00
[52] U.S. Cl. ................................ 221/74; 221/78; 206/713
[58] Field of Search ........................... 221/71–74, 78–81, 221/25, 26; 225/100; 206/713

[56] References Cited

U.S. PATENT DOCUMENTS

| | | | |
|---|---|---|---|
| 3,057,528 | 10/1962 | Cole et al. | 221/78 |
| 3,482,733 | 12/1969 | Graves | 221/25 |
| 3,817,422 | 6/1974 | Raitt | 221/74 |
| 5,706,952 | 1/1998 | Bianca et al. | 206/713 |
| 5,769,236 | 6/1998 | Maruyama et al. | 206/713 |

Primary Examiner—H. Grant Skaggs
Attorney, Agent, or Firm—Michael H. Jester

[57] ABSTRACT

A feeder for a pick and place machine used in connection with the mounting of small discrete parts such as electrical and mechanical components comprises a frame and mechanisms connected to the frame for advancing a carrier tape product from a supply reel. The carrier tape product preferably includes a pair of spaced apart continuous parallel carrier tapes having a series of longitudinally spaced parts with opposite sides molded over adjacent inner side edges of corresponding ones of the carrier tapes so that each part bridges the two carrier tapes. The feeder further comprises a separation station mounted to the frame for receiving the carrier tape from the supply reel. Mechanisms in the separation station are provided for exerting a sufficient force between a part in the separation station and the carrier tape to physically separate the part from the carrier tape without substantially displacing the part from a predetermined location on the separation station so as to impair the ability of the head of a pick and place machine to pick up the part. Preferably the force is exerted by preventing the inner side edges of the tapes from moving upwardly, by restraining the outer side edges of the tapes from inward movement toward the part, and by deflecting the intermediate portions of the tapes upwardly, causing the inner side edges of the tapes to break away from the part.

20 Claims, 10 Drawing Sheets

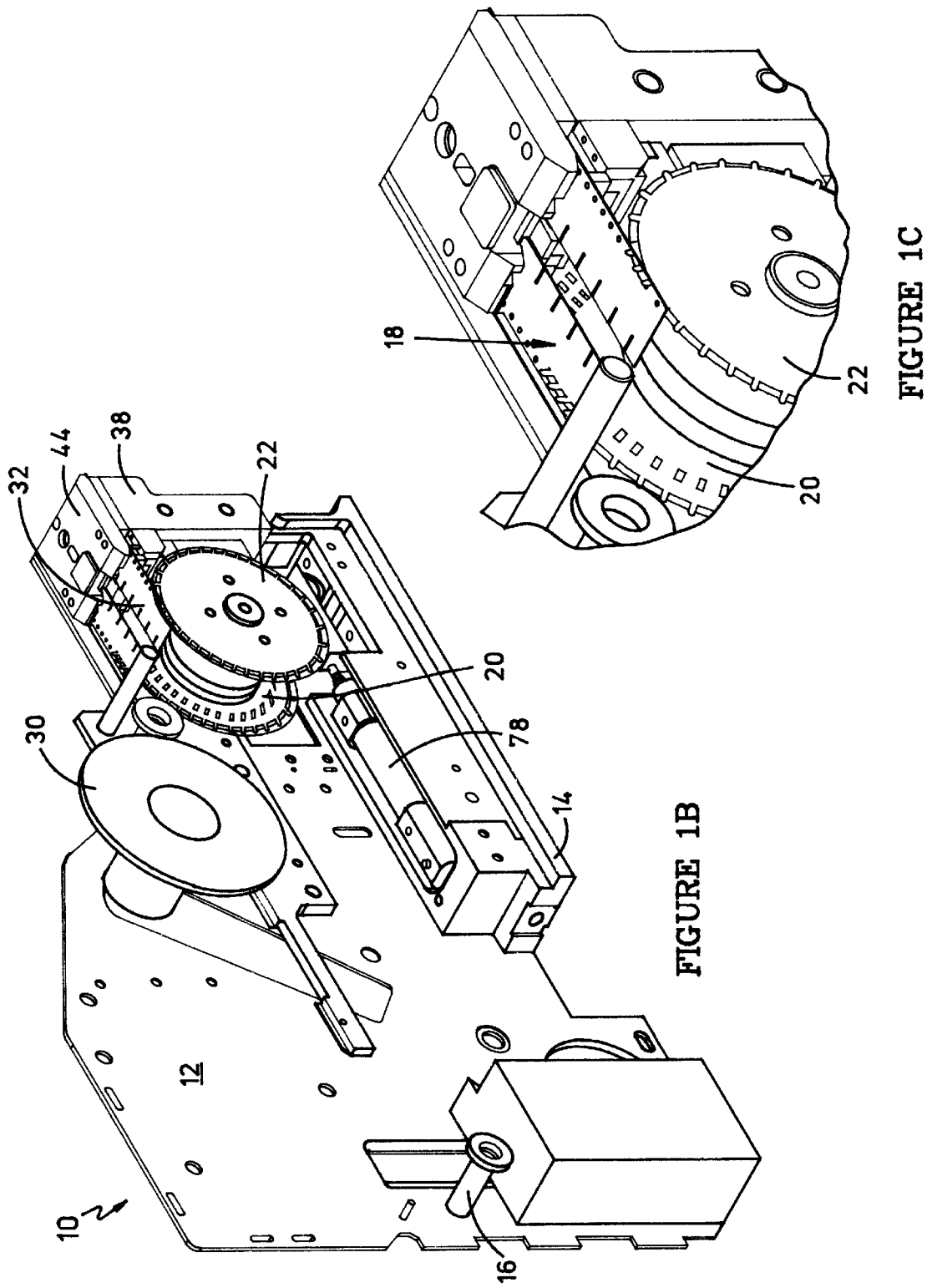

FEEDER FOR SEPARATING PARTS MOLDED TO A CONTINUOUS CARRIER TAPE

CROSS-REFERENCE TO RELATED APPLICATION

The subject application is related to U.S. patent application Ser. No. 08/584,534 filed Jan. 11, 1996 entitled CONTINUOUS CARRIER FOR ELECTRICAL OR MECHANICAL COMPONENTS of Giuseppe Bianca et oil., now U.S. Pat. No. 5,706,952, granted Jan. 13, 1998 the entire disclosure of which is specifically incorporated herein by reference.

BACKGROUND OF THE INVENTION

The present invention relates to methods and equipment for automated handling of small parts such as electrical and mechanical components, and more particularly, to a feeder designed to separate parts molded to a continuous carrier tape unwound from a supply reel.

Tape and reel supply of small discrete parts such as electrical and mechanical components for automatic pick and place on into a printed circuit board (PCB) or other substrate is widely used in the electronics industry. Examples of pick and place machines are those commercially available from Universal, Panasonic, Fuji and others. Typically the pick and place machines have multiple removable parallel feeders which each support a tape reel carrying a different component. An example of such a feeder is the MPF856 commercially available from Hover-Davis, Inc. In one carrier tape system commercialized by Advantek and 3M a plastic carrier tape with sprocket holes along one or both side edges is embossed to form a series of pockets which each carry a separate component covered by a continuous strip. The carrier tape is unreeled, its cover strip is peeled back, and a pick and place head removes a component adapted for surface mount or through hole from each pocket. The component is placed under precise computer control onto a given location on a PCB. The PCB usually has solder paste applied at precise locations which temporarily holds the component in place until solder reflow.

The aforementioned technique for tape and reel supply of small discrete parts has proven to be widely successful. However, it is costly, inconvenient, and does not provide accurate part location. The U.S. patent of Giuseppe Bianca et al. identified above describes a continuous carrier tape product preferably formed by overmolding one or both sides of a series of longitudinally spaced discrete small parts to one or a spaced pair of continuous flexible film strips. The film strip or strips may be provided with sprocket holes and wound on reels for use with a feeder and a pick and place machine. The parts are individually separated before placement onto a PCB. No embossing step of a plastic carrier is required, no assembly of parts into respective pockets is needed and no cover strip is needed to keep the parts from falling out of their respective pockets More parts can be carried per linear loot of tape. The result is that the cost of the tape and supply reel to the PCB assembler is reduced. In addition, the parts can be removed by either the suction head of a pneumatic pick and place machine or a gripper of a mechanical pick and place machine. The film strips are preferably made of a material capable of withstanding the elevated temperatures required to overmold the plastic parts. Preferably the molding overlap is selected to require the finished tape to be pulled with about three to five pounds of force to separate the part therefrom.

In order to advantageously utilize the new overmolded tape and reel product described in the aforementioned U.S. patent of Giuseppe Bianca et al., it would be desirable to provide a novel feeder capable of utilizing the product with conventional pick and place machines. Such a feeder would have to rapidly and reliably separate an individual part from the carrier tape without damaging the part and without displacing the part such that the head of the pick and place machine would be unable to pick up the same.

SUMMARY OF THE INVENTION

In accordance with the present invention a feeder comprises a frame and mechanisms connected to the frame for advancing a carrier tape product. The carrier tape product includes at least one continuous carrier tape having a series of longitudinally spaced parts connected to an edge thereof. The feeder further comprises a separation station mounted to the frame for receiving the carrier tape from the supply reel. Mechanisms in the separation station are provided for exerting a sufficient force between a part in the separation station and the carrier tape to physically separate the part from the carrier tape.

In accordance with the preferred embodiment of the feeder the carrier tape product includes a pair of spaced apart continuous parallel carrier tapes having a series of longitudinally spaced parts with opposite sides molded over adjacent inner side edges of corresponding ones of the carrier tapes so that each part bridges the two carrier tapes. The force exerting mechanisms pull the two carrier tapes outwardly in opposite directions away from a part in the separation station with sufficient force to break the physical connections between the part and the carrier tapes.

The present invention also provides a method of separating, a part from a carrier tape product including a series of longitudinally spaced parts connected to an edge of at least one continuous carrier tape. Broadly the method comprises the steps of advancing the carrier tape into a separation station. A sufficient force is then exerted between a part in the separation station and the carrier tape to physically separate the part from the carrier tape.

In accordance with the preferred embodiment of the method the carrier tape product includes a pair of spaced apart continuous parallel carrier tapes having a series of longitudinally spaced parts with opposite sides molded over adjacent inner side edges of corresponding ones of the carrier tapes so that each part bridges the two carrier tapes. The force is exerted by pulling the two carrier tapes outwardly in opposite directions away from a part in the separation station with sufficient force to break the physical connections between the part and the carrier tapes. Preferably the force is exerted by preventing the inner side edges of the tapes from moving upwardly, by restraining the outer side edges of the tapes from inward movement toward the part, and by deflecting the intermediate portions of the tapes upwardly, causing the inner side edges of the tapes to break away from the part.

BRIEF DESCRIPTION OF THE DRAWINGS

FIG. 1B is a reduced perspective view of the feeder of FIG. 1A showing the take up reel and drive wheels.

FIG. 1C is an enlarged portion of FIG. 1B showing the carrier tapes engaged with the drive wheels and a part broken away from the carrier tapes in the separation station ready for retrieval by the mechanical gripper head of a pick and place machine which is not shown.

DETAILED DESCRIPTION OF THE PREFERRED EMBODIMENTS

Referring to FIGS. 1A, 1B, 1C and 1D, a feeder 10 constructed in accordance with the present invention includes an elongated narrow frame including, a vertical panel 12 and a horizontal base 14 secured to a lower edge of the panel 12. The frame also includes an additional vertical panel or wing (not illustrated) that connects to the outer (left) end of the panel 12. The wing has a hub or axle for carrying a supply reel (not illustrated). The feeder 10 is preferably dimensioned and configured to meet the industry standard form factor for standard pick and place machines of the type identified above. For example, the feeder 10 can be manufactured in thirty-two, forty-four, fifty-six and seventy-two millimeter widths for side-by-side insertion into a pick and place machine along with other conventional feeders.

Figure 1A:
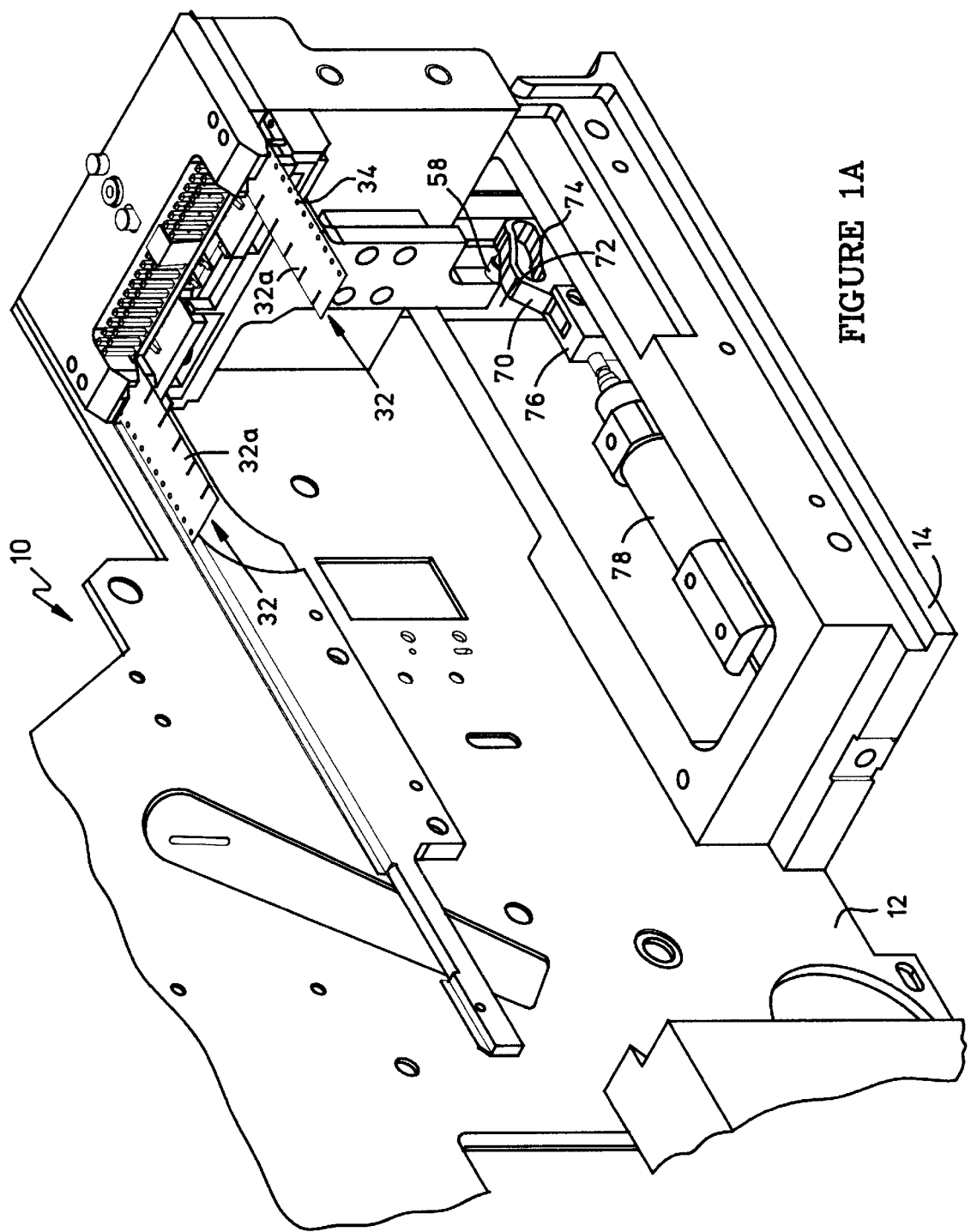
FIG. 1A is a perspective view of a preferred embodiment of the feeder of the present invention with its take up reel drive wheels and drive belts removed for the sake of clarity.
Figure 1D:
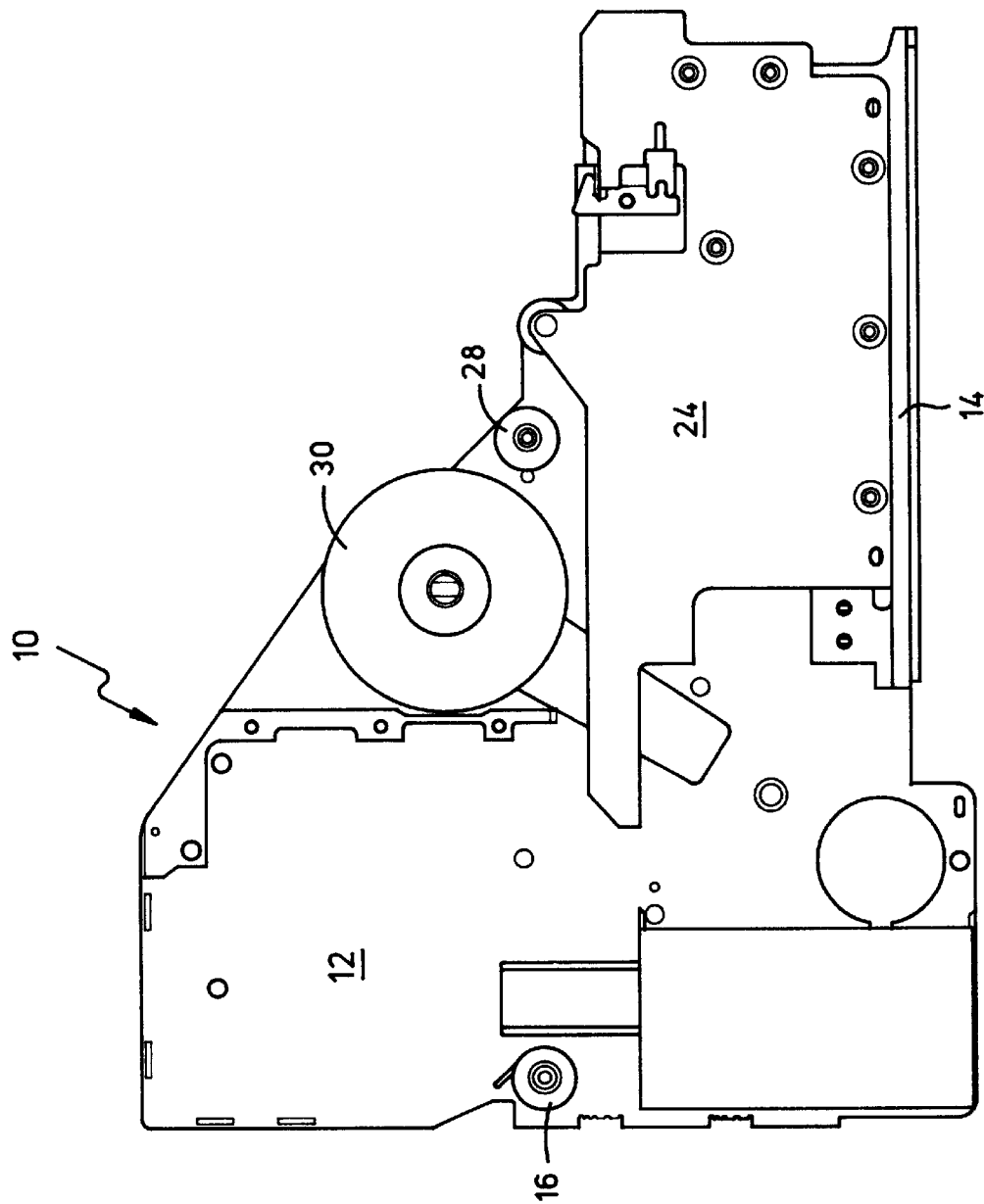
FIG. 1D is a side elevation view of the feeder of FIG. 1B.

A guide roller 16 (FIG. 1D) is rotatably mounted to the panel 12 for conveying a tape carrier product 18 (FIG. 1C) to a pair of toothed drive wheels 20 and 22 which advance the product 18 through a separation station 24 (FIG. 1D). The separation station 24 is supported on the base 14. The cover 26 of the separation station is removed in FIGS. 1A, 1B and 1C to reveal the mechanisms therein. Another guide roller 28 (FIGS. 1B and 1D) is rotatably mounted to the panel 12. A protective cover made of paper or other material on the upper side of the carrier tape product 18 is wrapped around the roller 28 before being wound about a take-up reel hub 30. The hub 30 is also rotatably mounted to the panel 12.

Figure 4A:
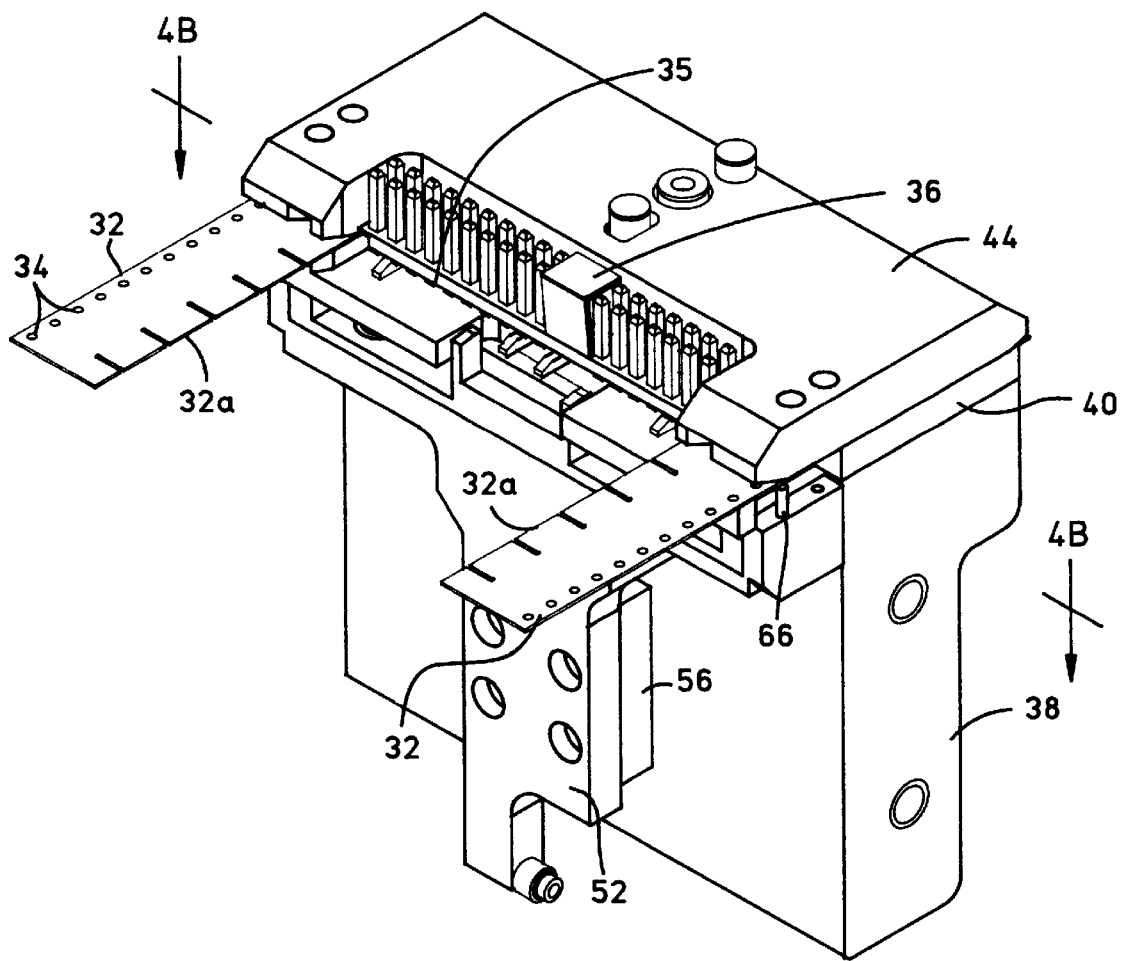
FIG. 4A is an enlarged perspective view of the portion of the separation station illustrated in FIG. 2B showing the carrier tapes traveling through the separation station.
Figure 4B:
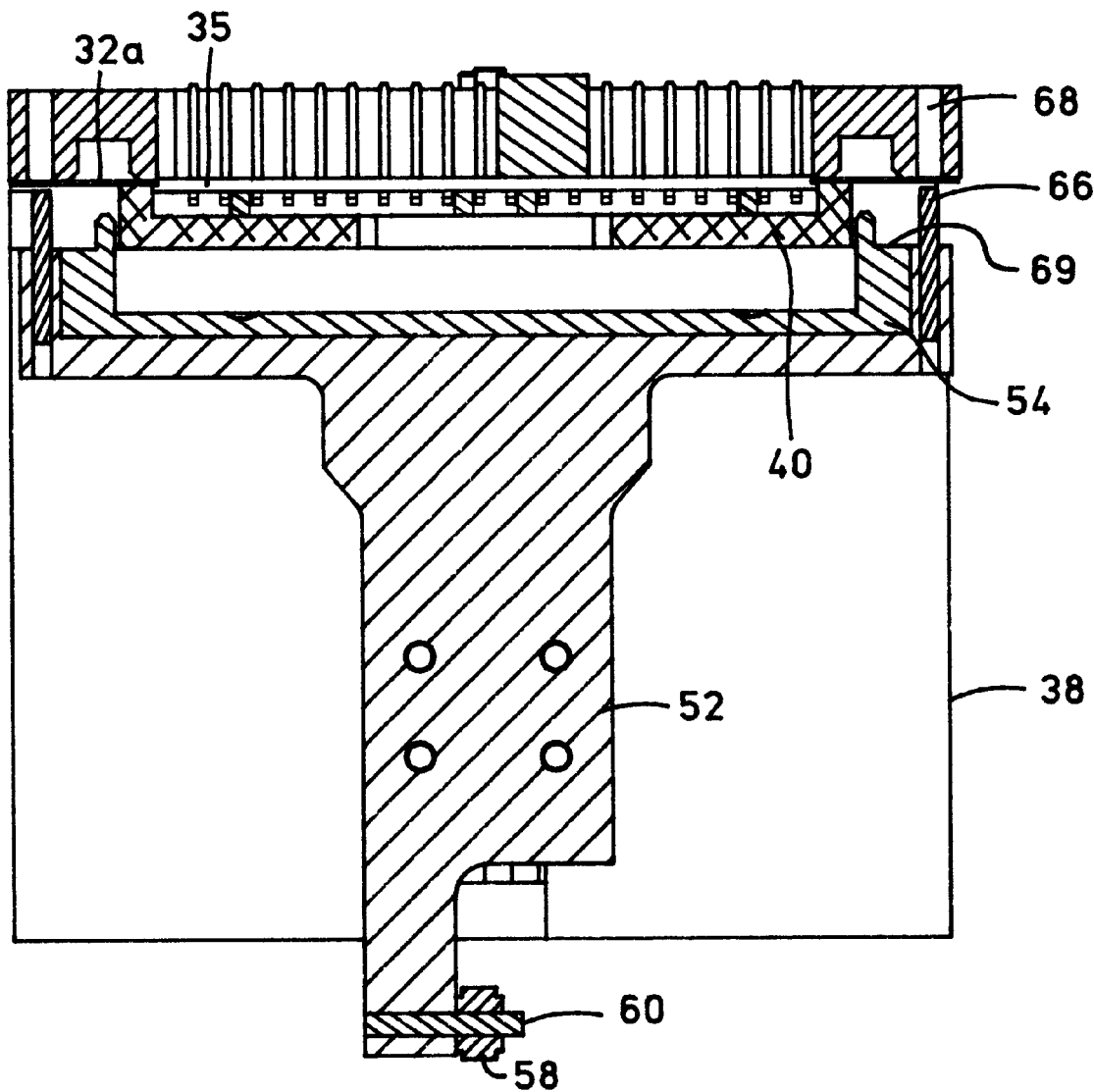
FIG. 4B is a vertical sectional view through the separation station taken along line 4B—4B of FIG. A.

The carrier tape product 18 is constructed in accordance with the disclosure of the U.S. patent of Giuseppe Bianca et al. identified above. It includes a pair of spaced apart continuous parallel carrier tapes 32 (FIG. 1A) in the form of plastic films. The carrier tapes 32 have a series of longitudinally spaced sprocket holes 34 formed in the outer side edges thereof for receiving the teeth of the drive wheels 20 and 22. The inner side edges of the carrier tapes 32 are formed with a series of transversely extending slits to define individual flanges or tabs 32a. Referring to FIG. 4B a series of longitudinally spaced parts 35 such as plastic headers with multiple pins have their opposite sides molded over adjacent tabs 32a of the inner side edges of corresponding ones of the carrier tapes 32. The term "part" refers not only to electronic components and small discrete electrical devices, but also any small workpiece or element such as a button used is sewing, a part of a fishing lure, a small piece used to assemble another device, a fastener, and so forth. Each part 35 bridges the two carrier tapes 32. The parts can be successively separated from the two carrier tapes 32 such as by pulling outwardly on the carrier tapes as hereafter described in detail. This permits the head of a conventional pick and place machine (not illustrated), which may have mechanical grippers or a suction device, to pick up the part 35 and carry it to another location, such as the surface of a PCB (not illustrated). The header shown as the part 35 in FIGS. 4A, 4B and 4C is inverted with its pins facing upwardly and has a clip 36 to facilitate suction pick up.

The drive wheels 20 and 22 (FIG. 1C) are preferably driven by a precision stepper motor (not illustrated) through a drive belt (not shown) that also drives the take up hub 30. The stepper motor may be driven by a conventional control system that provides precision sequential advancement of the carrier tape product 18 at selected pitches and rates which are manually entered through push buttons. Such controls are well known in the art.

Figure 2A:
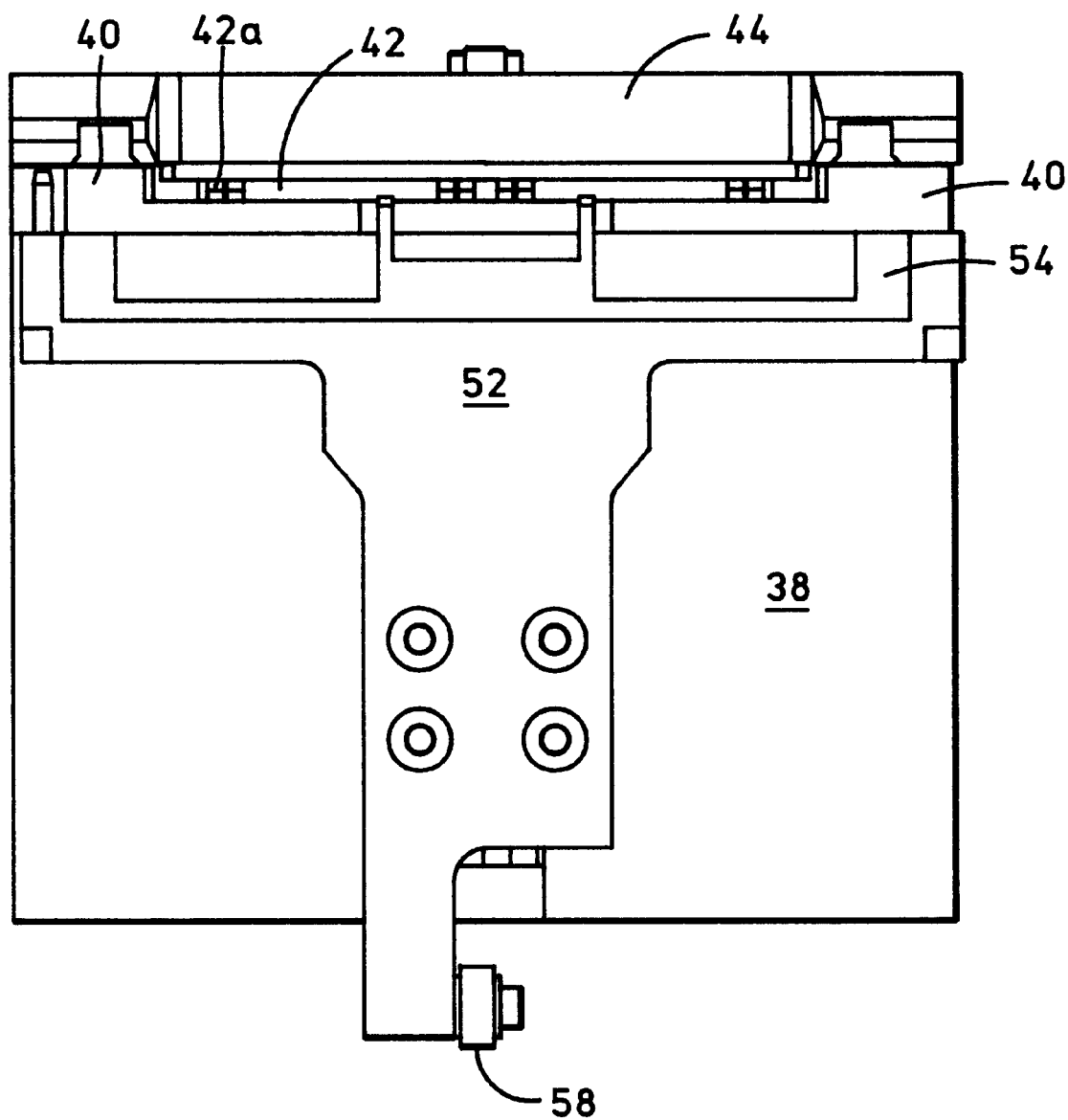
FIG. 2A is an enlarged front elevation view of a portion of the separation station of the preferred embodiment of the feeder.
Figure 2B:
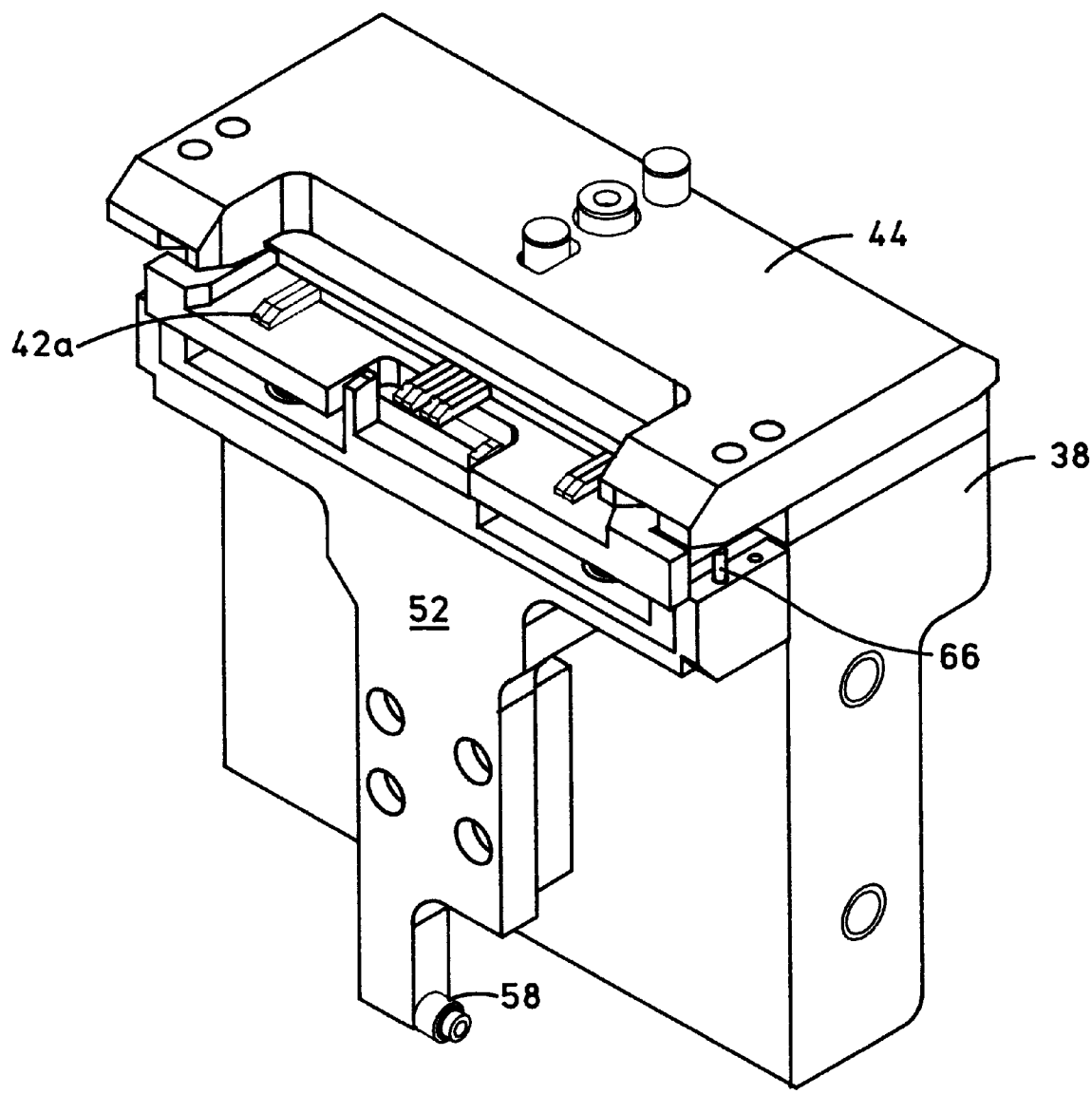
FIG. 2B is an enlarged perspective view of the portion of the separation illustrated in FIG. 2A.
Figure 3:
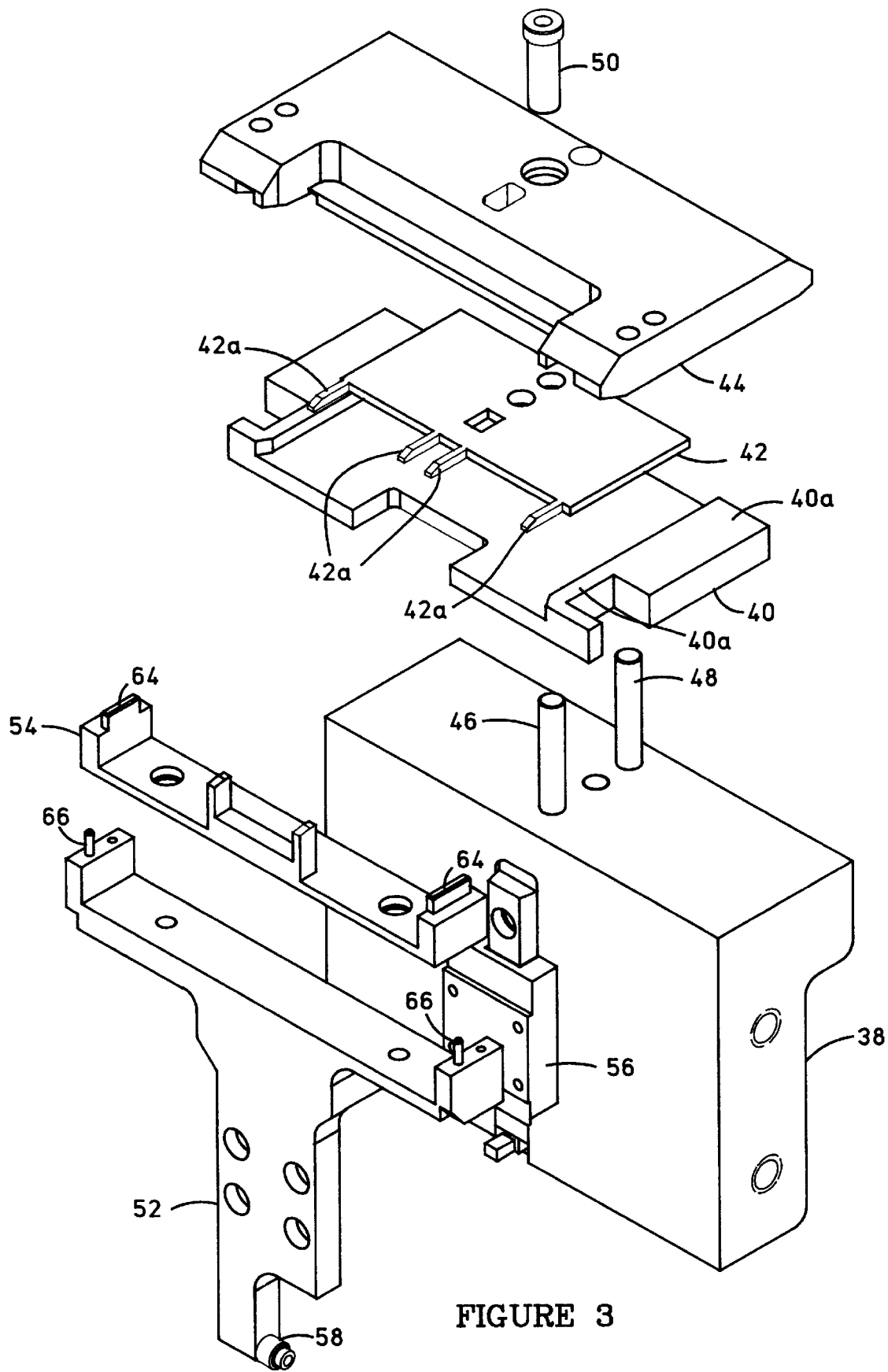
FIG. 3 is an enlarged exploded perspective view of the portion of the separation station illustrated in FIGS. 2A and 2B.

The separation station 24 accomplishes at least three basic functions. It positions the part 35 at a predetermined location for pick up by the grippers or head of a pick and place machine. It also separates the part 35 from the carrier tapes 32. The separation station 24 also supports the separated part 35 at the predetermined pick up location for the grippers or head of the pick and place machine. Referring to FIGS. 2B, 3 and 4A the separation station 24 includes a base 38, on top of which are mounted a shim plate 40, a support plate 42 and a top plate 44 which are aligned by dowel pins 46 and 48 and secured together by a bolt 50. A punch comprised of a T-shaped punch frame 52 having a punch insert 54 vertically reciprocates along a sidewall of the base 38. The punch frame 52 is secured with four screws to a carriage block 56 that slides in a recess formed in the sidewall of the base 38. A bearing. 58 is rotatably mounted to the lower end of the T-shaped punch frame 52 via an axle 60 and acts as a cam follower as described hereafter. The support plate 42 has an upwardly facing horizontal surface. Four finger portions 42a of the support plate 42 extend in a rearward direction and provide small discrete horizontal support surfaces that engage the underside of the plastic body of the part 35 as best seen in FIGS. 4B, 4C and 5. The finger portions 42a of the support plate thus hold the part 35 at a predetermined elevation within the separation station 24 when then carrier tapes 32 are pulled therefrom.

Figure 4C:
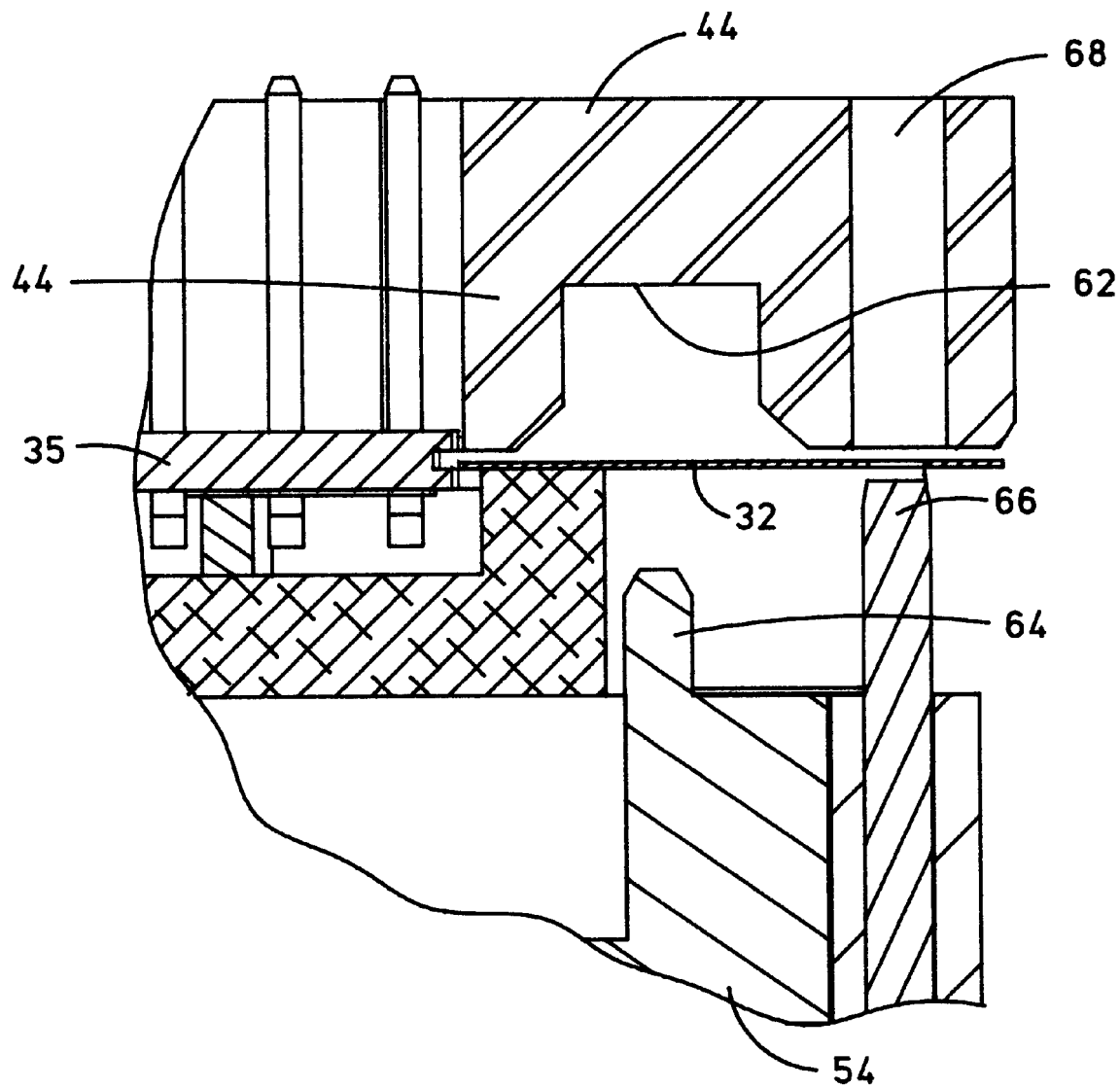
FIG. 4C is an enlarged portion of FIG. 4B illustrating the manner in which the part is supported in the separation station, the inner edge of a carrier tape is prevented from moving upwardly, the outer edge of the carrier tape is pinned, and the punch deflects the intermediate portion of the carrier tape upwardly to pull the carrier tape away from the part. The raised landings of the punch and the adjacent alignment pin are shown in their lowered positions.
Figures 5, 6:
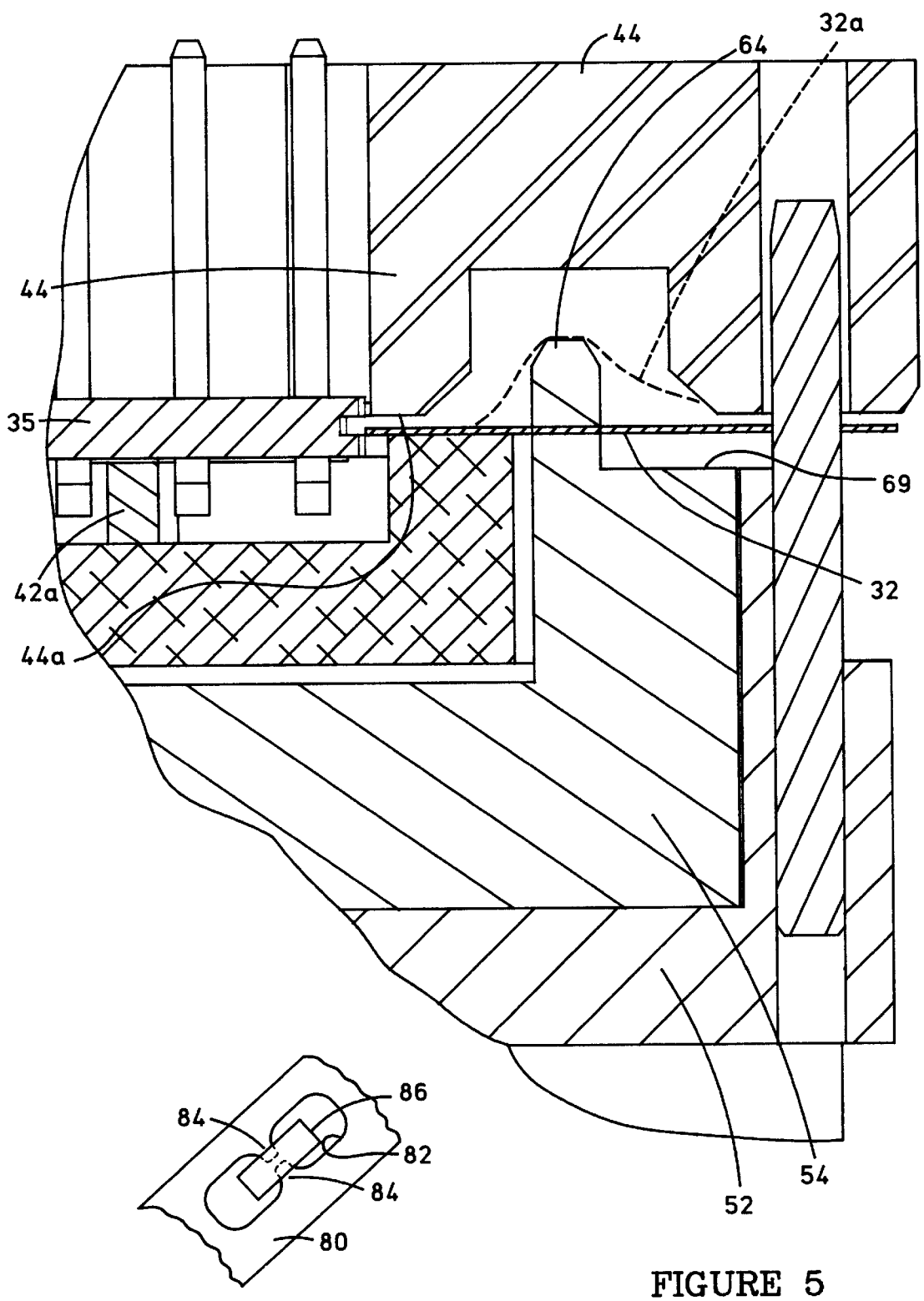
FIG. 5 is an enlargement of FIG. 4C showing the raised position of the punch landings and adjacent alignment pin as well as further details of the separation station.
FIG. 6 is a diagrammatic view illustrating an alternate embodiment of the carrier tape product.

As best seen in FIG. 4C, the outer side portions of the top plate 44 have longitudinally extending, grooves 62 formed in the underside thereof for having the intermediate portions of the carrier tapes 32 deflected upwardly into the same by the landings 64 on the punch insert 54. The upward deflection of one of the flanges or tabs 32a of one of the carrier tapes 32 is shown diagrammatically as a dashed line in FIG. 5. The position and shape of the tab 32a prior to deflection by the landing 64 is shown in solid lines in FIG. 5. Thus it can be seen the carrier tapes are preferably pushed in a direction that is non-parallel to a common plane of the carrier tapes to cause them to pull away from the part. The inner edges of the carrier tapes are thus pulled laterally away from the part.

Referring to FIG. 3, the punch frame 52 includes a pair of upstanding alignment pins 66 that are temporarily inserted through corresponding sprocket holes 34 in the outer side edges of the carrier tapes 32 prior to the landings 64 deflecting, the tabs 32a of the carrier tapes 32 upwardly. This serves to restrain the carrier tapes 32 from moving inwardly toward the part 35 so that the deflection of the carrier tapes results in outwardly directed pulling forces. The alignment pins 66 are also received in alignment holes 68 (FIG. 4C) in the side edges of the top plate 44. Upwardly facing shoulders 69 (FIG. 5) of the punch insert 54 also clamp the carrier tapes 32 adjacent their outer edges against the underside of the top plate 44. This clamping also helps restrain the carrier tapes 32 from moving inwardly.

The width of the punch insert 54 can be changed to accommodate different carrier tape product widths. The height of the punch landings 64 can be changed to accommodate different part sizes or carrier tape product configurations. The shim plate 40 (FIG. 3) has a pair of upstanding shoulders with upwardly facing horizontal surfaces 40a. These surfaces 40a are positioned directly opposite of downwardly facing horizontal surfaces 44a (FIG. 4C) on corresponding downwardly directed inner shoulders of the top plate 44. The carrier tapes 32 slide in the gap between these two horizontal surfaces with the carrier tapes sliding over and engaging the surfaces 40a. The surfaces 40a of the shim plate thus determine the vertical of the tabs 32a of the carrier tapes. This is important to proper separation of the carrier tapes 32 from each part 35 as it passes through the separation station 24. The downwardly facing horizontal surfaces 44a of the inner shoulders of the top plate 44 prevent the inner portions of the carrier tapes 32 front moving upwardly when the landings 64 of the punch engage the intermediate portions of the carrier tapes 32. Since the alignment pins 66 are inserted in the sprocket holes 34 they prevent inward movement of the carrier tapes. The upward deflection of the carrier tapes 32 by the landings 64 separates the carrier tapes 32 from the part 35. The inward facing vertical walls of the shoulders that define the horizontal surfaces 40a and 44a prevent lateral movement of the part 35.

When the punch frame 52, punch insert 54 and punch landings 64 are at their maximum vertical extensions, the part 35 is maintained at its predetermined location optimum for pick up by the pick and place machine. The part 35 does not move substantially away from this position as the carrier tapes 32 are pulled away. Bouncing or other substantial lateral displacement of the part 35 as it is broken away from the carrier tapes 32 would impair accurate and repeatable pick up. Each part 35 is sequentially moved into position by the stepper motor driven wheels 20 and 22 (FIG. 1C) and then the movement of the carrier tapes 32 is momentarily stopped to allow for reciprocation of the punch frame 52.

The mechanisms for reciprocating the punch frame 52 include a cam plate or member 70 (FIG. 1A) mounted to the base 14. The cam member has a slot 72 for receiving the cam roller 58 connected to the remote lower end of the punch frame 52. The slot 72 has an upwardly facing ramp surface 74 along which the roller 58 rides to provide the proper timing and stroke of the punch reciprocation. The cam member 70 is connected via a clevis 76 to a drive actuator in the form of a pneumatic cylinder 78 for moving the cam member 70. The pneumatic cylinder 78 is attached to pressurized source and return lines (not illustrated). Valving (not illustrated) associated with these lines is opened and closed by solenoids which are in turn actuated by a control circuit that operates in coordination with the system that controls the stepper motor for sequential advancement of the carrier tapes.

While preferred embodiments of the feeder and carrier tape separation method of the present invention have been described in detail, modifications of the same will occur to those skilled in the art. For example the feeder could be modified to push down on the carrier tapes or to pull them outwardly by direct lateral forces. The carrier tape product itself could be varied in configuration as taught in the co-pending application of Giuseppe et al. requiring modifications to the feeder. For example, metal parts could be cast over the adjacent side edges of a carrier tape capable of maintaining its integrity at metal casting temperatures. The separation action could include pulling out the tapes as well as breaking or shearing the tapes. As shown in FIG. 6 a single plastic carrier tape 80 could be formed with a series of longitudinally spaced, relatively large apertures 82, each with two oppositely extending inwardly directed flanges 84. In another modification, the pick and place machine could hold the part stationary, while the carrier tapes would be pulled away from the part substantially in the manner described above. Alternatively, the tapes could be held while the part were pulled away therefrom. For example, a pneumatic pick and place head could make contact with the part, and then pull it away from the carrier tapes. It is also possible that a combination of movement of both the part and the carrier tapes could produce the required separation, either movement in opposite directions, or movement in the same direction, so long as their is a deferential rate in that movement to produce a separating force. A part 86 could be molded over these opposite flanges 84. Therefore the protection afforded the method and apparatus disclosed herein should only be limited in accordance with the scope of the following claims.

We claim:

1. A feeder, comprising:
    a frame:
    means mounted to the frame for advancing a carrier tape product, the carrier tape product including a pair of continuous carrier tapes having a series of longitudinally spaced parts having opposite sides molded over adjacent inner side edges of corresponding ones of the carrier tapes so that each part brides the two carrier tapes; and
    a separation station mounted to the frame for receiving the carrier tapes from the advancing means, including means for exerting a sufficient force to pull the two carrier tapes outwardly in opposite directions away from a part with sufficient force to break the physical connections between the part and the carrier tapes.

2. A feeder according to claim 1 wherein the separation station includes means for holding the part at a predetermined elevation within the separation station and means for restraining the outer side edges of the carrier tapes from moving inwardly toward the part, and the force exerting means is configured to simultaneously push on the carrier tapes in a direction non-parallel to a common plane of the carrier tapes to cause the carrier tapes to pull away from the part.

3. A feeder according to claim 2 wherein the force exerting means includes a punch having a pair of landings spaced for engaging the carrier tapes, and means for reciprocating the punch to cause the landings to push against the carrier tapes in a direction substantially perpendicular to the common plane of the carrier tapes to cause the carrier tapes to pull away from the part.

4. A feeder according to claim 3 wherein the separation station is configured so that the carrier tapes travel therethrough with their common plane substantially horizontal and the punch landings push up against the carrier tapes to cause the carrier tapes to pull away from the part.

5. A feeder according to claim 3 wherein the means for reciprocating the punch includes a cam member mounted to the frame, a bearing connected to a remote end of the punch and positioned to ride on the cam member, and a drive actuator for moving the cam member.

6. A feeder according to claim 2 wherein the carrier tapes are each formed with a series of longitudinally spaced sprocket holes therethrough and the restraining means includes a pair of alignment pins and means for temporarily inserting the alignment pins through predetermined sprocket holes in each of the carrier tapes opposite the part while the part is located in the station and prior to or at the same time that the force exerting means pushing on the carrier tapes.

7. A feeder according to claim 2 wherein the means for holding the part at a predetermined elevation within the separation station includes a horizontal support plate.

8. A feeder according to claim 7 wherein the separation station further includes a top plate positioned above the support plate and defining a pair of gaps for slidably receiving and guiding the carrier tapes.

9. A feeder according to claim 1 wherein the advancing means includes a drive wheel for simultaneously engaging both of the carrier tapes.

10. A method of separating a part from a carrier tape product including a series of longitudinally spaced parts having opposite sides molded over adjacent inner side edges of corresponding ones of a pair of parallel carrier tapes so that each part bridges the two carrier tapes, comprising the steps of;

advancing the carrier tape into a separation station; and exerting a sufficient force between a part in the separation station and the carrier tapes to physically separate the part from the carrier tape, the force being exerted by pulling the two carrier tapes outwardly in opposite directions away from a part in the separation station with sufficient force to break the physical connections between the part and the carrier tapes.

11. A method according to claim 10 wherein the part is held in the separation station at a predetermined elevation, the outer side edges of the carrier tapes are restrained from moving inwardly toward the part, and the carrier tapes are simultaneously pushed in a direction non-parallel to a common plane of the carrier tapes to cause the carrier tapes to pull away from the part.

12. A method according to claim 11 wherein the carrier tapes travel through the separation station with their common plane generally horizontal and the carrier tapes are pushed upwardly to separate the part therefrom.

13. A method according to claim 12 wherein the carrier tapes are each formed with a series of longitudinally spaced sprocket holes therethrough and the tapes are restrained by temporarily inserting a pair of alignment pins through predetermined sprocket holes in each of the carrier tapes opposite the part while the part is located in the station and prior to or at the same time that pushing on the carrier tapes occurs.

14. A method according to claim 12 wherein the part is supported on a horizontal support plate and the inner edges of the carrier tapes are prevented from moving upwardly by a top plate.

15. A method according to claim 12 wherein the carrier tapes are clamped adjacent their outer edges while their intermediate portions are deflected upwardly.

16. A method according to claim 11 wherein an intermediate portion of each carrier tape is pushed on.

17. A feeder for a pick and place machine, comprising:

an elongate narrow frame;

means mounted to the frame for advancing a carrier tape product from a supply reel, the carrier tape product including a pair of spaced apart continuous parallel carrier tapes having a series of longitudinally spaced parts having opposite sides molded over adjacent inner side edges of corresponding ones of the carrier tapes so that each part bridges the two carrier tapes, the carrier tapes each being formed with a series of longitudinally spaced sprocket holes in the an outer side edge thereof; and a separation station mounted to the frame for receiving the carrier tape from the supply reel supporting means including a generally horizontal support plate for slidably receiving on an upper surface thereof each part as it passes through the station, a top plate overlying the support plate for preventing substantial upward movement of the inner side edges of the carrier tapes and having parallel downwardly opening grooves formed therein for allowing upward deflection of an intermediate portion of a corresponding one of the carrier tapes, a punch mounted to the frame for vertical reciprocation and having a pair of landings for engaging the intermediate portions of the carrier tapes and alignment pins for simultaneously entering into corresponding adjacent ones of the sprocket holes so that the outer side edges of the carrier tapes will be restrained when the intermediate portions of the carrier tapes are deflected upwardly into the grooves in the top plate to exert a sufficient force between a part in the separation station and the carrier tapes to physically separate the part from the carrier tapes without substantially displacing the part from a predetermined location on the separation station, and means for reciprocating the punch.

18. A feeder according to claim 17 wherein the separation station further comprises a vertically adjustable shim plate for holding the support plate and for engaging an underside of the inner side edge of each of the carrier tapes.

19. A feeder according to claim 17 wherein the means for reciprocating the punch includes a cam member mounted to the frame, a bearing connected to a remote end of the punch positioned to ride on the cam member, and a drive actuator for moving the cam member.

20. A feeder according to claim 17 wherein the advancing means include a pair of toothed drive wheels.

* * * * *

UNITED STATES PATENT AND TRADEMARK OFFICE
CERTIFICATE OF CORRECTION

PATENT NO. : 5,967,365
DATED : October 19, 1999
INVENTOR(S) : Robert M. Bogursky et al.

It is certified that an error appears in the above-identified patent and that said Letters Patent is hereby corrected as shown below:

In Claim 1, line 46, change "brides" to -- bridges --.

Signed and Sealed this

Twenty-fifth Day of July, 2000

*Attest:*

Q. TODD DICKINSON

*Attesting Officer*     *Director of Patents and Trademarks*